US012793199B2

(12) United States Patent
Seo et al.

(10) Patent No.: US 12,793,199 B2
(45) Date of Patent: Nov. 10, 2026

(54) WAFER WOBBLING DETECTION METHOD AND WAFER WOBBLING DETECTION SYSTEM

(71) Applicant: GSF Solution Co., Ltd., Cheongju-si (KR)

(72) Inventors: Seungwon Seo, Hwaseong-si (KR); Donghyun Kim, Seoul (KR)

(73) Assignee: GSF solution Co., Ltd., Cheongju-si (KR)

( * ) Notice: Subject to any disclaimer, the term of this patent is extended or adjusted under 35 U.S.C. 154(b) by 190 days.

(21) Appl. No.: 18/889,532

(22) Filed: Sep. 19, 2024

(65) Prior Publication Data

US 2025/0157021 A1 May 15, 2025

(30) Foreign Application Priority Data

Nov. 15, 2023 (KR) ........................ 10-2023-0157840

(51) Int. Cl.
*G06T 7/00* (2017.01)
*H10P 74/20* (2026.01)

(52) U.S. Cl.
CPC .......... *G06T 7/0004* (2013.01); *H10P 74/203* (2026.01); *G06T 2207/30148* (2013.01)

(58) Field of Classification Search
CPC ......... G06T 7/0004; G06T 2207/30148; H10P 74/203; H10P 72/0604; H10P 72/7604
See application file for complete search history.

(56) References Cited

U.S. PATENT DOCUMENTS 10,032,656 B2 * 7/2018 Shinozaki ........... H10P 72/0412
2014/0373884 A1 12/2014 Shinozaki
2018/0367719 A1 * 12/2018 Wang .................... G06T 7/0004

FOREIGN PATENT DOCUMENTS

| | | | |
|---|---|---|---|
| JP | 2015-5567 | A | 1/2015 |
| KR | 10-1997-0077405 | A | 12/1997 |
| KR | 10-2005-0015065 | A | 2/2005 |
| KR | 10-2005-0099880 | A | 10/2005 |
| KR | 10-1681517 | B1 | 12/2016 |
| KR | 10-2023-0066937 | A | 5/2023 |

OTHER PUBLICATIONS

Office Action dated Feb. 3, 2026, in Japanese Application No. 2024-196785.

* cited by examiner

*Primary Examiner* — Utpal D Shah
(74) *Attorney, Agent, or Firm* — Sughrue Mion, PLLC

(57) ABSTRACT

Proposed are a wafer wobbling detection method and a wafer wobbling detection system, the method and the system being applied to a semiconductor processing device that performs a process while a wafer is rotated. The method includes securing a wafer surface image such that a reflection image which is reflecting a fixture and which is positioned on a surface of a wafer is included in the wafer surface image and detecting wobbling by analyzing the reflection image in the secured image, the reflection image being moved due to wobbling. In the system, a photographed image of a rotating wafer is analyzed with machine vision, so that wafer wobbling may be detected during a process for the wafer is performed. In addition, such as stopping the device in real time when abnormal wobbling occurs may be performed since wafer wobbling may be detected while the process for the wafer is performed.

12 Claims, 4 Drawing Sheets

FIG. 3

| 1st abnormal region | | | 2nd abnomal region | | |
|---|---|---|---|---|---|
| | proportion (%) | Yield Data | | proportion (%) | Yield Data |
| 1 | 0~2 | 98% ~ | 1 | 0~2 | 89% ~ |
| 2 | 2~5 | 97% ~ | 2 | 2~5 | 82% ~ |
| 3 | 5~9 | 94% ~ | 3 | 5~9 | 75% ~ |
| 4 | 9~15 | 90% ~ | 4 | 9~15 | 65% ~ |
| 5 | 15~25 | 83% ~ | 5 | 15~25 | 53% ~ |
| ... | ... | ... | ... | ... | ... |

UPPER LIMIT OF PROPORTIOIN OF
REFLECTION IMAGE WITHIN EACH REGION

WAFER WOBBLING DETECTION METHOD AND WAFER WOBBLING DETECTION SYSTEM

CROSS REFERENCE TO RELATED APPLICATION

The present application claims priority to Korean Patent Application No. 10-2023-0157840, filed Nov. 15, 2023, the entire contents of which are incorporated herein for all purposes by this reference.

TECHNICAL FIELD

This research was financially supported by the Ministry of Small and Medium-sized Enterprises (SMEs) and Startups (MSS), Korea, under the "Regional Specialized Industry Development Plus Program (R&D, S3368242)" supervised by the Korea Technology and Information Promotion Agency for SMEs (TIPA).

BACKGROUND OF THE INVENTION

Field of the Invention

The present disclosure relates to a method and a system for detecting wobbling of a wafer. More particularly, the present disclosure relates to a method and a system for detecting wobbling of a wafer that is rotated at high speed in a semiconductor processing device.

Description of the Related Art

Generally, in a process of manufacturing a semiconductor, many semiconductor processing devices used to perform a specific process on a semiconductor wafer perform the process in a state in which the wafer is rotated at a high speed. For example, in a wafer cleaning device, the wafer cleaning device is operated such that a cleaning solution is discharged to a surface of a wafer while the wafer is rotated.

As such, a wafer that is rotated at a high speed in a semiconductor processing device may wobble due to influences such as vibration of the device and so on. At this time, wobbling within a predetermined range does not affect a process, but a problem occurs in a process when excessive wobbling occurs. Excessive wobbling may be caused by a problem occurring in a device such as a rotation device, or may occur when a wafer to be processed is not accurately mounted on the device.

In order to prevent such a problem, a technology of securing wafer wobbling information and determining an operational error by comparing the wafer wobbling information with standard information during performing a preventive maintenance or an emergency maintenance on a semiconductor processing device has been developed.

However, when excessive wobbling occurs before a maintenance is performed, it is difficult to check the operational error. Furthermore, when a problem occurs in the semiconductor processing device, all wafers that are input to perform the technology are required to be discarded until the maintenance is performed or until a defect in a wafer is found. In addition, when a problem is not a problem of the semiconductor processing device but a problem of a wafer mounting process, a failure of a precision device may occur. Therefore, a technology capable of detecting wobbling of a wafer in real time while the semiconductor processing device is performing an operation is required.

Document of Related Art (Patent Document 1) Korean Patent No. 10-1681517

SUMMARY OF THE INVENTION

Accordingly, the present disclosure has been made keeping in mind the above problems occurring in the related art, and an objective of the present disclosure is to provide a method and a system capable of detecting wobbling of a wafer while an operation is performed in a semiconductor processing device.

In order to achieve the objective described above, according to an aspect of the present disclosure, there is provided a wafer wobbling detection method applied to a semiconductor processing device that performs a process while an internally mounted wafer is rotated, the wafer wobbling detection method including: securing a wafer surface image such that a reflection image which is reflecting a fixture and which is positioned on a surface of a wafer is included in the wafer surface image, the fixture being mounted inside the semiconductor processing device and having a fixed position; and detecting wobbling by analyzing the reflection image in the secured image, the reflection image being moved due to wobbling.

In the analyzing the reflection image, a predetermined position in the secured image may be set as a normal region, a first abnormal region disposed such that the first abnormal region surrounds the normal region may be set, and the analyzing the reflection image may be performed by calculating proportion of the reflection image of the secured image within each region.

At this time, an offset region having a predetermined width between the normal region and the first abnormal region may further be set.

In addition, a second abnormal region disposed such that the second abnormal region surrounds the first abnormal region may further be set. Furthermore, each upper limit value of proportion in which the reflection image is capable of being included may be set separately for the first abnormal region and the second abnormal region, and abnormal wobbling may be determined when each proportion of the reflection image within the first abnormal region and the second abnormal region exceeds each of the upper limit values.

In the analyzing the reflection image, a closed loop in which pixels are connected to each other may be set in a predetermined position in the secured image, numbers may be assigned to each of the pixels included in the closed loop, and a direction in which wobbling occurs may be detected through each number of the pixels where the reflection image is mainly positioned.

According to another aspect of the present disclosure, there is provided a wafer wobbling detection system applied to a semiconductor processing device that performs a process while an internally mounted wafer is rotated, the wafer wobbling detection system including: a fixture mounted inside the semiconductor processing device and positioned in a fixed position; a camera configured to secure a wafer surface image such that a reflection image which is reflecting the fixture and which is positioned on a surface of a wafer is included in the wafer surface image; and a machine vision analysis part configured to detect wobbling of the wafer by analyzing the secured image, wherein the machine vision analysis part is configured to detect wobbling of the wafer by analyzing the reflection image in the secured image, the reflection image being moved due to wobbling.

The machine vision analysis part may be configured to set a predetermined position in the secured image as a normal region, may be configured to set a first abnormal region disposed such that the first abnormal region surrounds the normal region, and may be configured to calculate proportion of the reflection image of the secured image within each region.

At this time, the machine vision analysis part may be further configured to set an offset region having a predetermined width between the normal region and the first abnormal region.

In addition, the machine vision analysis part may be further configured to set a second abnormal region disposed such that the second abnormal region surrounds the first abnormal region. Furthermore, the machine vision analysis part may be configured to set, separately for the first abnormal region and the second abnormal region, each upper limit value of proportion in which the reflection image is capable of being included, and may be configured to determine abnormal wobbling when each proportion of the reflection image within the first abnormal region and the second abnormal region exceeds each of the upper limit values.

The machine vision analysis part may be configured to set a closed loop in which pixels are connected to each other in a predetermined position in the secured image, may be configured to assign numbers to each of the pixels included in the closed loop, and may be configured such that a direction in which wobbling occurs is capable of being detected through each number of the pixels where the reflection image is mainly positioned.

In the present disclosure as described above, by analyzing the secured photographed image of the rotating wafer with machine vision, there is an effect that wafer wobbling is capable of being detected while a process for the wafer is performed.

In addition, since the wafer wobbling is capable of being detected while the process for the wafer is performed, there is an excellent effect that control such as stopping the device in real time when abnormal wobbling occurs is capable of being performed.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 3 is an example of positions of reflection images and corresponding yield data in the wafer wobbling detection system according to an embodiment of the present disclosure.

DETAILED DESCRIPTION OF THE INVENTION

Figure 1:
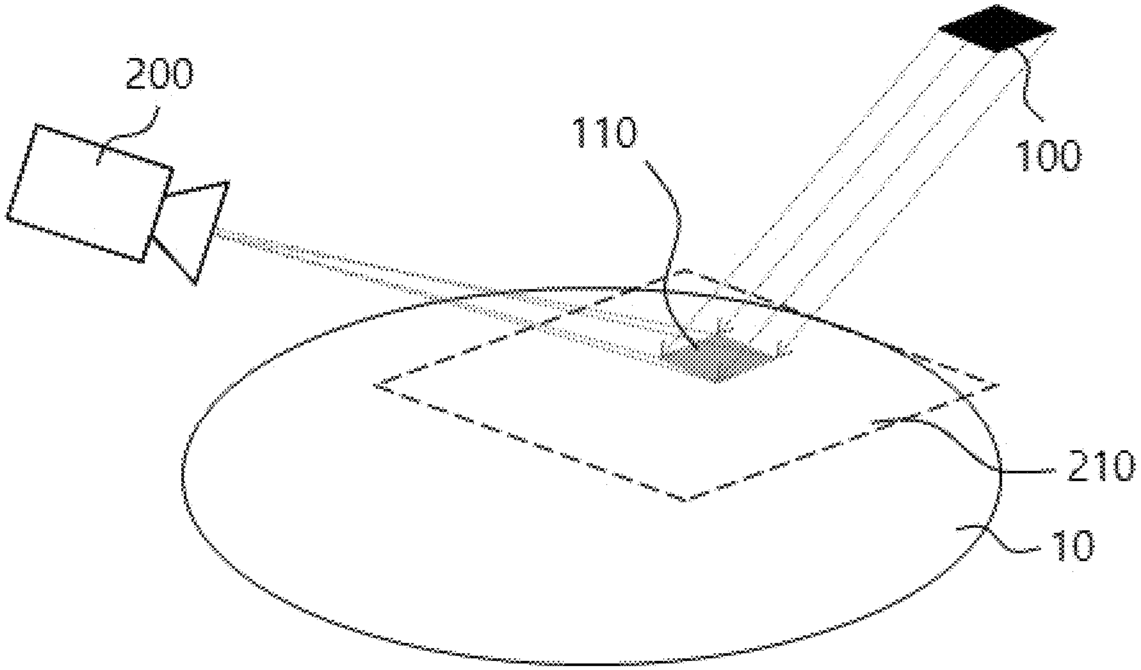
FIG. 1 is a view illustrating a structure of a wafer wobbling detection system according to an embodiment of the present disclosure.

Hereinafter, an embodiment of the present disclosure will be described in detail with reference to the accompanying drawings.

However, embodiments of the present disclosure may be modified in a variety of different forms, and the scope of the present disclosure is not limited to the embodiments described below. The shapes and sizes of the elements in the drawings may be exaggerated for clarity, and elements denoted by the same reference numerals in the drawings are the same elements.

Throughout the specification, it will be understood that when an element is referred to as being "connected" to another element, it can be directly connected to the other element or it can be electrically connected with the other element and intervening elements may be present therebetween. In addition, it will be further understood that when a part "comprises", "includes", or "has" an element, this means that other elements are not excluded but may be further included, unless otherwise stated.

Also, the terms such as "first", "second", etc. may be used to distinguish one element from another element, and the scope of the present disclosure must not be limited by these terms. For example, a first constitutive element may be referred as a second constitutive element, and the second constitutive element may be also referred to as the first constitutive element.

FIG. 1 is a view illustrating a structure of a wafer wobbling detection system according to an embodiment of the present disclosure.

A wafer wobbling detection system according to an embodiment of the present disclosure includes a fixture 100, a camera 200, and a machine vision analysis part (not illustrated).

An object on which the wafer wobbling detection system of the present embodiment is installed may be any semiconductor processing device in which a wafer is rotated during a process, and is not particularly limited to the extent that characteristics of the present disclosure are not impaired.

The fixture 100 is a component mounted inside the semiconductor processing device, and is a component configured such that a reflection image 110 of the fixture 100 reflected on a surface of a wafer 10 photographed by the camera 200. Since a position of the fixture 100 is not particularly limited when the reflection image 110 of the fixture 100 is checked in a photographing range 210 photographed from the camera 200, the fixture 100 may be a structure originally mounted inside the device. However, it is preferable that the fixture 100 is a component that is separately added so that an identification power is increased. In the embodiment, a sticker having a square shape is attached to the ceiling of the device.

The camera 200 is a component for photographing an image so as to detect wobbling, and is configured such that at least a portion of the wafer 10 that is rotated is photographed and included within the photographing range 210. The camera used in the present disclosure is not specifically limited as long as the camera has a resolution capable of analyzing an image by machine vision. In the present disclosure, the photographing range 210 photographed by the camera 200 is important. Specifically, the camera 200 is mounted such that the reflection image 110 which is reflecting the fixture 100 which is positioned on the surface of the wafer 10 is included in the photographing range 210.

At this time, as a distance from the center of the wafer 10 increases, a movement of a wafer surface due to wobbling increases, so that the closer the reflection image 110 of the fixture 100 is positioned adjacent to an edge of the wafer 10, the more advantageous it is for detecting wobble. Therefore, it is preferable that the reflection image 110 of the fixture 100 is positioned adjacent to the edge of the wafer 10 by adjusting a relative position and a relative angle between the fixture 100 and the camera 200. Particularly, in an image photographed by the camera 200, it is recommended that a distance of the reflection image 110 from a wafer center portion is at least 60% of a wafer radius, it is preferable that the distance of the reflection image 110 from the wafer center portion is at least 70% of the wafer radius, and it is more preferable that the distance of the reflection image 110 from the wafer center portion is at least 80% of the wafer radius. Meanwhile, when the reflection image 110 of the fixture 100 is positioned excessively adjacent to the edge side of the wafer 10, there may be a problem that the reflection image 110 is not detected when the reflection image 110 is deviated from a region of the wafer 10 due to wobbling, so that it is preferable that the distance of the reflection image 110 from the wafer center portion is equal to or less than 95% of the wafer radius.

The machine vision analysis part is a component configured to detect wobbling of the rotating wafer 10 by analyzing the image photographed by the camera. Since the position of the camera 200 is fixed, an angle of the surface of the rotating wafer 10 with respect to the camera 200 is continuously changed due to wobbling, so that the reflection image 110 of the fixture 100 reflected on the surface of the wafer 10 in the photographed image is not fixed and has no choice but to move. Therefore, wobbling of the wafer is capable of being detected by detecting the position and the movement of the reflection image 110 in the photographed image of the surface of the wafer. A method in which the machine vision analysis part detects a position of the reflection image 110 may be applied in various manners, and a method through detecting a pixel may be applied.

Figure 2:
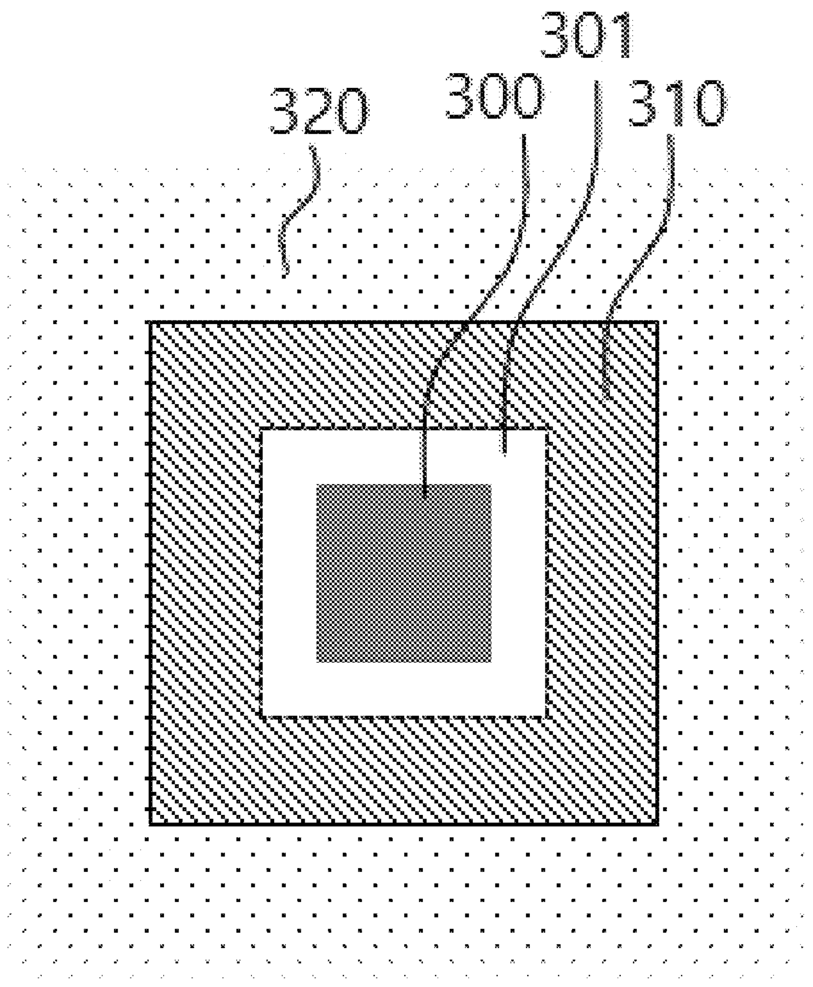
FIG. 2 is a view illustrating a detection method according to a position of a reflection image in the wafer wobbling detection system according to an embodiment of the present disclosure.

FIG. 2 is a view illustrating a detection method according to a position of a reflection image in the wafer wobbling detection system according to an embodiment of the present disclosure.

In FIG. 2, a portion where the reflection image 110 is positioned in the image photographed by the camera 200 is enlarged and illustrated.

In the embodiment, regions are set such that the machine vision analysis part is capable of detecting and evaluating a wobbling state according to the position of the reflection image. First of all, a normal region 300 is a region in which the reflection image is positioned when wobbling occurs in a normal range. A first abnormal region 310 is disposed such that the first abnormal region 310 surrounds the outside of the normal region 300, and a second abnormal region 320 is disposed such that the second abnormal region 320 surrounds the outside of the first abnormal region 310.

The machine vision analysis part is configured to calculate proportion of the reflection image within each region. At this time, an upper limit value is set on the basis of yield data for the proportion of the reflection image within each region. Furthermore, when the proportion of the reflection image within each region exceeds the upper limit value, it may be determined that there is a device failure or a wafer mounting error, and an operation of the semiconductor processing device may be stopped.

FIG. 3 is an example of positions of reflection images and corresponding yield data in the wafer wobbling detection system according to an embodiment of the present disclosure.

As shown in the drawing, in an embodiment, the yield is at a level of 90% when the proportion at the first abnormal region 310 is 15%, and setting is performed to determine that abnormal wobbling has occurred when the proportion at the first abnormal region 310 exceeds 15%. Meanwhile, the yield is lowered below 89% when the proportion at the second abnormal region 320 exceeds 2%, so that setting is performed to determine that abnormal wobbling has occurred when the proportion at the second abnormal region 320 exceeds 2%. In the present embodiment, abnormal wobbling is determined by applying only the yield data, but may be determined by including time and material cost along with the yield.

Meanwhile, unlike a mirror, the surface of the wafer 10 does not have excellent reflective characteristics, the reflection image 110 is affected by diffuse reflection, and the reflection image 110 may be distorted by the flow of a liquid applied to the surface of the wafer 10 during a process.

Therefore, in the present embodiment, an offset region 301 having a 1 mm interval between the normal region 300 and the first abnormal region 310 is set, and the proportion at the first abnormal region 310 is calculated outside the offset region 301. The width of the offset region 301 is not limited to the width of the offset region 301 in the present embodiment, and may be changed variously.

Figure 4:
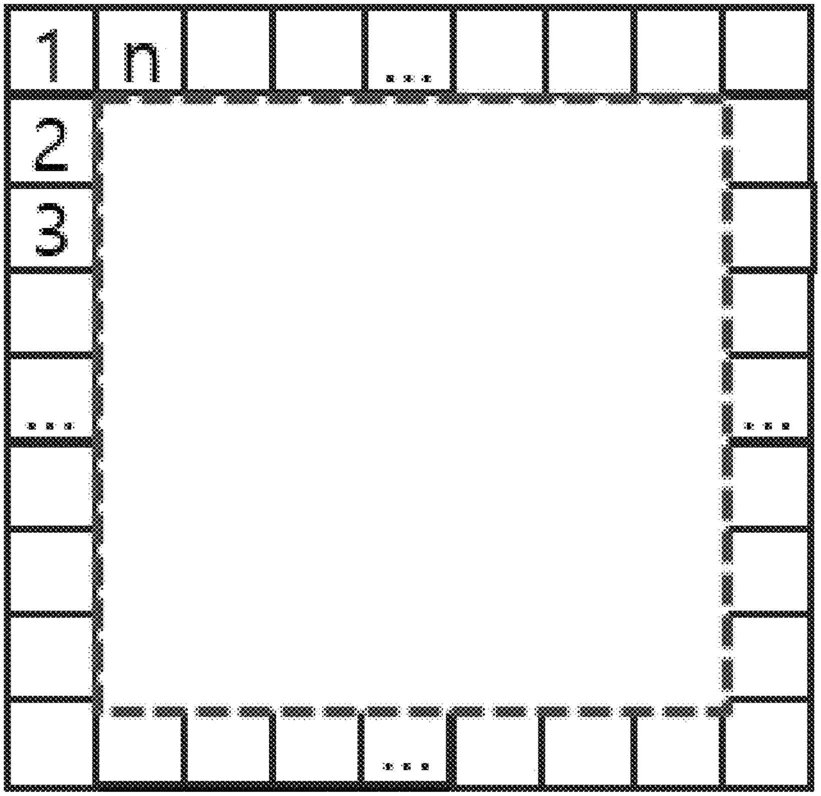
FIG. 4 is a view illustrating a detection method according to a movement of reflection image in the wafer wobbling detection system according to an embodiment of the present disclosure.

FIG. 4 is a view illustrating a detection method according to a movement of reflection image in the wafer wobbling detection system according to an embodiment of the present disclosure.

As illustrated in the drawing, a closed loop formed by connecting pixels is set, and numbers are assigned to each of the pixels so as to distinguish each of the pixels included in the closed loop.

By performing a pixel analysis for the position of the reflection image, a position where the reflection image passes through the pixels included in the closed loop is capable of being checked. A direction to which the reflection is mainly moved may be known through the number of the pixels where the reflection image is mainly positioned and, accordingly, a direction in which wobbling occurs may be detected.

As such, since wobbling is detected by analyzing the position and the movement of the reflection image reflected on the wafer surface, wobbling of the wafer may be accurately detected even while the semiconductor processing device is performing a process.

Although the preferred embodiments of the present disclosure have been disclosed for illustrative purposes, those skilled in the art will appreciate that various modifications, additions and substitutions are possible, without departing from the technical idea of the present disclosure. Therefore, the scope of protection of the present disclosure should be determined by the scope of the appended claims, rather than the specific embodiments, and all technical ideas falling within the scope of the claims should be construed as being included in the scope of the present disclosure.

What is claimed is:

1. A wafer wobbling detection method applied to a semiconductor processing device that performs a process while an internally mounted wafer is rotated, the wafer wobbling detection method comprising:

securing a wafer surface image such that a reflection image which is reflecting a fixture and which is positioned on a surface of a wafer is included in the wafer surface image, the fixture being mounted inside the semiconductor processing device and having a fixed position; and detecting wobbling by analyzing the reflection image in the secured image, the reflection image being moved due to wobbling.

2. The wafer wobbling detection method of claim 1, wherein, in the analyzing the reflection image, a predetermined position in the secured image is set as a normal region, a first abnormal region disposed such that the first abnormal region surrounds the normal region is set, and the analyzing the reflection image is performed by calculating proportion of the reflection image of the secured image within each region.

3. The wafer wobbling detection method of claim 2, wherein an offset region having a predetermined width between the normal region and the first abnormal region is further set.

4. The wafer wobbling detection method of claim 2, wherein a second abnormal region disposed such that the second abnormal region surrounds the first abnormal region is further set.

5. The wafer wobbling detection method of claim 4, wherein each upper limit value of proportion in which the reflection image is capable of being included is set separately for the first abnormal region and the second abnormal region, and abnormal wobbling is determined when each proportion of the reflection image within the first abnormal region and the second abnormal region exceeds each of the upper limit values.

6. The wafer wobbling detection method of claim 1, wherein, in the analyzing the reflection image, a closed loop in which pixels are connected to each other is set in a predetermined position in the secured image, numbers are assigned to each of the pixels included in the closed loop, and a direction in which wobbling occurs is capable of being detected through each number of the pixels where the reflection image is mainly positioned.

7. A wafer wobbling detection system applied to a semiconductor processing device that performs a process while an internally mounted wafer is rotated, the wafer wobbling detection system comprising:

a fixture mounted inside the semiconductor processing device and positioned in a fixed position;

a camera configured to secure a wafer surface image such that a reflection image which is reflecting the fixture and which is positioned on a surface of a wafer is included in the wafer surface image; and a machine vision analysis part configured to detect wobbling of the wafer by analyzing the secured image, wherein the machine vision analysis part is configured to detect wobbling of the wafer by analyzing the reflection image in the secured image, the reflection image being moved due to wobbling.

8. The wafer wobbling detection system of claim 7, wherein the machine vision analysis part is configured to set a predetermined position in the secured image as a normal region, is configured to set a first abnormal region disposed such that the first abnormal region surrounds the normal region, and is configured to calculate proportion of the reflection image of the secured image within each region.

9. The wafer wobbling detection system of claim 8, wherein the machine vision analysis part is further configured to set an offset region having a predetermined width between the normal region and the first abnormal region.

10. The wafer wobbling detection system of claim 8, wherein the machine vision analysis part is further configured to set a second abnormal region disposed such that the second abnormal region surrounds the first abnormal region.

11. The wafer wobbling detection system of claim 10, wherein the machine vision analysis part is configured to set, separately for the first abnormal region and the second abnormal region, each upper limit value of proportion in which the reflection image is capable of being included, and is configured to determine abnormal wobbling when each proportion of the reflection image within the first abnormal region and the second abnormal region exceeds each of the upper limit values.

12. The wafer wobbling detection system of claim 7, wherein the machine vision analysis part is configured to set a closed loop in which pixels are connected to each other in a predetermined position in the secured image, is configured to assign numbers to each of the pixels included in the closed loop, and is configured such that a direction in which wobbling occurs is capable of being detected through each number of the pixels where the reflection image is mainly positioned.

* * * * *